United States Patent

Wells

Patent Number: 5,905,356
Date of Patent: May 18, 1999

[54] SOLAR POWERED CHARGER FOR VEHICULAR ACCESSORIES AND CORDLESS TOOLS

[76] Inventor: Gilbert Michael Wells, 10343 Sahara, San Antonio, Tex. 78216

[21] Appl. No.: 08/800,820

[22] Filed: Feb. 14, 1997

Related U.S. Application Data

[60] Provisional application No. 60/031,125, Nov. 18, 1996.

[51] Int. Cl.$^6$ ............... H02J 7/00; H01L 31/04; B60L 11/18
[52] U.S. Cl. ............... 320/2; 320/61; 136/246; 136/291; 180/65.3
[58] Field of Search ............... 320/2, 61; 136/244–251, 136/291–293; 180/68.5, 65.3

[56] References Cited

U.S. PATENT DOCUMENTS

| | | | |
|---|---|---|---|
| 4,181,188 | 1/1980 | Dessert | 180/65.3 X |
| 4,209,346 | 6/1980 | King | 320/2 X |
| 4,327,316 | 4/1982 | Fujikubo et al. | 320/2 |
| 4,660,879 | 4/1987 | Kobayashi et al. | 136/246 X |
| 4,786,851 | 11/1988 | Fuji et al. | 320/2 |
| 4,830,038 | 5/1989 | Anderson et al. | 136/251 |
| 4,911,257 | 3/1990 | Kajimoto et al. | 136/291 X |
| 5,157,271 | 10/1992 | Fujiwara | 307/66 |
| 5,317,145 | 5/1994 | Corio | 250/203.4 |
| 5,379,753 | 1/1995 | Noennich | 126/608 |
| 5,600,124 | 2/1997 | Berger | 250/203.4 |
| 5,632,823 | 5/1997 | Sharan | 136/246 |

*Primary Examiner*—Peter S. Wong
*Assistant Examiner*—K. Shin
*Attorney, Agent, or Firm*—Novak Druce & Burt

[57] ABSTRACT

A light energy powered charging system for recharging portable units such as battery powered hand tools and cellular telephones. The charging system includes a solar collection assembly having at least one light energy receiving panel. The collection assembly is mountable to a carrying vehicle. A multi-position connector is coupled to the receiving panel for facilitating the positioning of the panel toward a light source such as the sun or vehicle headlights. A power receiver is electrically connected to the receiving panel for accepting electricity generated at the solar collection assembly. The power receiver has a docking station for releasably receiving a battery powered portable unit such as a powered hand tool or a cellular telephone requiring recharging. The invention further includes a carrying motor vehicle. The solar collection assembly is coupled to the carrying motor vehicle by the multi-position connector. The carrying motor vehicle is a pick-up truck having a tool box located in a bed of the truck and the solar collection assembly is coupled to the tool box by the multi-position connector. The power receiver is positioned within the tool box located in a bed of the truck.

20 Claims, 5 Drawing Sheets

SOLAR POWERED CHARGER FOR VEHICULAR ACCESSORIES AND CORDLESS TOOLS

This application claims the benefit under 35 U.S.C. 119(e) of U.S. Provisional Application No. 60/031,125 filed Nov. 18, 1996.

FIELD OF THE INVENTION

The present invention generally relates to solar powered recharging of batteries. More particularly, the present invention relates to recharging typically portable accessories and devices carryable in engine powered vehicles by solar powered collectors mounted at the exterior of the carrying vehicle.

BACKGROUND OF THE INVENTION

As our society becomes more mobile and simultaneously dependent upon electronic devices, it has been a natural progression for portable electronics to proliferate. This has given rise to a need for portable power sources that can be carried with these electronic devices during their portable use. Still further, because presently commercialized batteries are normally limited in capacity with respect to reasonable and expected use of such devices, industries have turned to rechargeable "battery packs" that may be charged between uses thereby obviating the need for frequent battery replacement.

One such area or industry which is enjoying a substantial increase in the incorporation of rechargeable battery packs is found in powered hand tools. A well known and common example is the battery powered rotary screw-driver having a rechargeable battery pack housed within the handle of the tool which may be "docked" in a charging stand. When the tool is not in use and is docked in the stand, the incorporated battery is being recharged for later use. Obviously, there must be a source of power for this recharger and therefore these rechargers are found at locations with power plug facilities. Because of the portable nature of these tools, it is not always convenient to return to such a stationary recharging unit. Instead, it has been recognized as a particularly beneficial aspect to have the capability to recharge such tools while they are being carried on a vehicle, but not in actual use.

The problem arises in that a ready power source is often not available on such a vehicle, and particularly when the vehicle is stationary with the engine stopped. In such a situation, the generator provided in the vehicle to power accessories and recharge the engine's battery is not operating unless the engine is running. Therefore, limited capabilities for recharging such portable tools places constraints on their use in truly remote locations or over extended periods of time when away from a stationary charging unit.

With the proliferation of communication devices such as cellular telephones and pagers that are battery powered, the necessity for recharging units has become even more important. Both types of these communication devices are often used in automobiles and for extended periods of time away from typical locations where stationary recharging units would be maintained. As an example, a cellular telephone user will often be away from their office for the entirety of a day and reliant upon pre-charged battery packs for powering the telephones. As a result, the need for portable recharging facilities is becoming ever more important and is expected to increase even more so with the increase in portable personal computers that are also often used at remote locations on battery pack power.

As a result of these needs for recharging capabilities at remote locations and on transporting vehicles, the present invention has been developed and designed to remedy the identified deficiencies and satisfy the consumer's needs.

SUMMARY OF THE INVENTION

This invention includes features and/or components that have been invented and selected for their individual and combined benefits and superior performance as a system for recharging battery powered devices carried on a motor vehicle. The system includes multiple components that individually and singularly have new and novel features in and of themselves. Each of the individual components, however, work in association with, and are optimally mated to the others. Together, they yield an overall recharging system that has superior collective effectiveness in recharging portable battery packs.

Referring now to specific embodiments of the recharger assembly, additional benefits and advantageous features will be appreciated. One embodiment of the present invention is a light energy powered charging system for recharging portable units such as battery powered hand tools and cellular telephones. The charging system includes a solar collection assembly having at least one light energy receiving panel. The collection assembly is mountable to a carrying vehicle. A multi-position connector is coupled to the receiving panel for facilitating the positioning of the panel toward a light source such as the sun or vehicle headlights. A power receiver is electrically connected to the receiving panel for accepting electricity generated at the solar collection assembly. The power receiver has a docking station for releasably receiving a battery powered portable unit such as a powered hand tool or a cellular telephone requiring recharging.

In at least one embodiment, the invention further includes a carrying motor vehicle. The solar collection assembly is coupled to the carrying motor vehicle by the multi-position connector. In one example, the carrying motor vehicle is a pick-up truck having a tool box located in a bed of the truck and the solar collection assembly is coupled to the tool box by the multi-position connector.

In at least one embodiment, the power receiver is positioned within the tool box located in a bed of the truck.

In an exemplary embodiment, the multi-position connector is a cyclops connector that permits the solar collection assembly to be variously positioned so that the light energy receiving panel is faceable toward a light source.

In at least one embodiment, the multi-position connector has a first pivot connection for rotating the solar collection assembly about a substantially horizontal axis between backward and forward facing configurations. Similarly, the multiposition connector may have a second pivot connection for swinging the solar collection assembly about a substantially vertical axis between different sideward facing configurations.

In one application, a power hand tool is installed into the docking station of the power receiver for recharging a battery pack housed within the hand tool.

In another application, a cellular telephone installed into the docking station of the power receiver for recharging a battery pack housed within the cellular telephone.

In the illustrated embodiment, the solar collection assembly has a frame within which the light energy receiving panel is coupled between a front-side panel and a back-side panel wherein the front-side panel and the back-side panel are for protecting the light energy receiving panel. Antistatic insulation is sandwiched between the light energy receiving panel and the back-side panel for attracting static electricity away from the light energy receiving panel.

As an option, a rubber coating may be adhered to at least a portion of an exterior surface of the solar collection assembly for protecting the solar collection assembly and resisting the invasion of moisture into an interior of the solar collection assembly. Also as an option, a flexible cover may be wrapped about an exterior surface of the solar collection assembly for protecting the solar collection assembly. In one embodiment, the flexible cover is releasably coupled to the solar collection assembly; preferably by snap connectors. A typical flexible cover is opaque to prevent light energy from reaching the solar collection assembly when the cover is installed thereupon and in turn preventing the generation of electrical energy by the charging system. This effectively turns the power generator off by excluding the light energy that is needed for fuel.

In one embodiment, the solar collection assembly is electrically connected to the power receiver by electrical connective wiring that passes through a wall of the tool box. As an option, a passage through the wall of the tool box may be a grommetted aperture through which the electrical connective wiring extends; the grommetted aperture at least partially forms a seal about the wiring thereby resisting the invasion of moisture into the interior of the tool box. Still further, an electrical conduit sheath may be used to surround the electrical connective wiring between the solar collection assembly and the wall of the tool box for additional protection thereto.

Among those benefits and improvements that have been disclosed, other objects and advantages of this invention will become apparent from the following description taken in conjunction with the accompanying drawings. The drawings constitute a part of this specification and include exemplary embodiments of the present invention and illustrate various objects and features thereof.

DESCRIPTION OF THE ILLUSTRATIVE DRAWINGS

DESCRIPTION OF THE INVENTION

Figure 1:
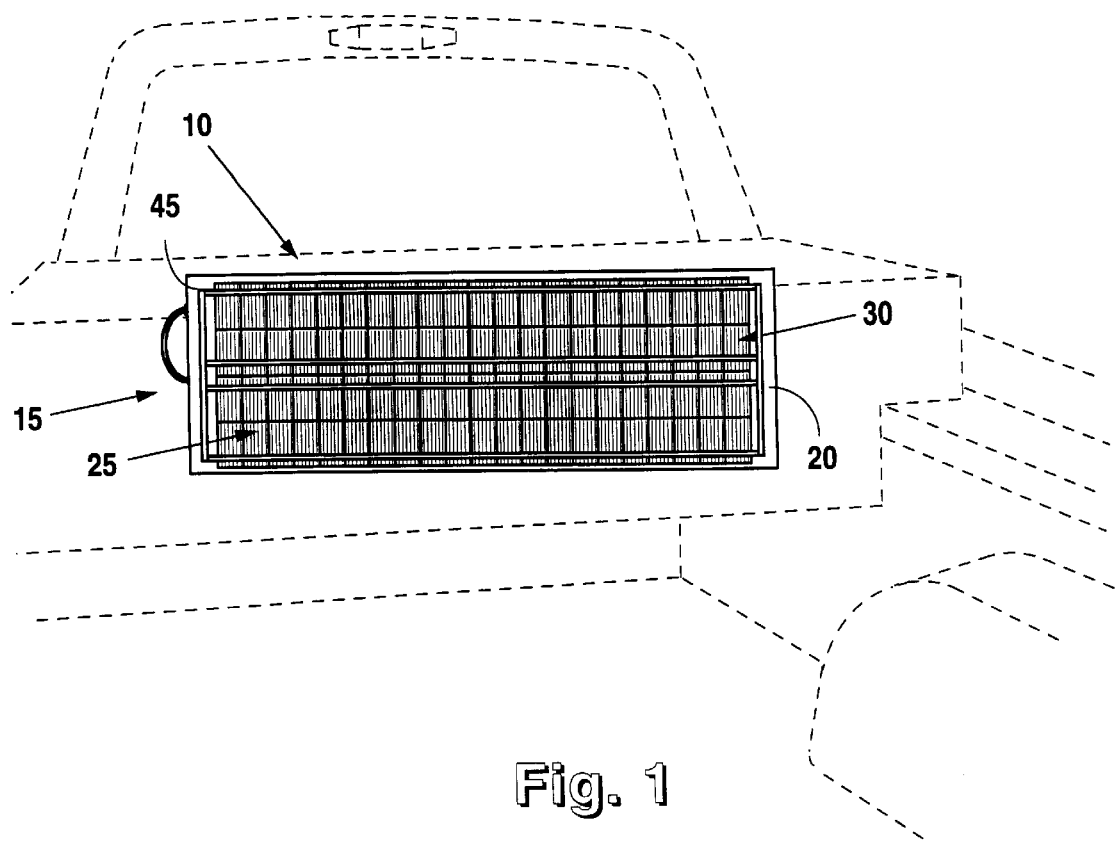
FIG. 1 is a rear view of a pick-up truck tool box having a recharger assembly mounted thereupon.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated to show details of particular components. Therefore, specific structural and functional details disclosed herein are not to be interpreted as limiting, but merely as a basis for the claims and as a representative basis for teaching one skilled in the art to variously employ the present invention.

Certain terminology will be used in the following description for convenience and reference only and not for purposes of limitation. For example, the words "rightwardly", "leftwardly", "upwardly" and "downwardly" will refer to directions in the drawings to which reference is made. The words "inwardly" and "outwardly" refer to directions toward and away from, respectively, the geometric center of the structure being referred to. This terminology includes these words, specifically mentioned derivatives thereof, and words of similar import.

Furthermore, elements may be recited as being "coupled"; this terminology's use anticipates elements being connected together in such a way that there may be other components interstitially located between the specified elements, and that the elements may be connected in fixed or movable relation one to the other. Certain components may be described as being adjacent to one another. In these instances, it is expected that such a relationship so described shall be interpreted to mean that the components are located proximate to one another, by not necessarily in contact with each other. Normally there will be an absence of other components positioned therebetween, but this is not a requirement. Still further, some structural relationships or orientations may be designated with the word "substantially". In those cases, it is meant that the relationship or orientation is as described, with allowances for variations that do not effect the cooperation of the so described component or components.

Referring to FIG. 1, the solar collection assembly 15 of the recharger assembly 10 may be seen. The primary components of the recharger assembly 10 comprise the solar collection assembly 15 connected by the electrical connective wiring 60 to a power receiver 65 that is shown herein as a battery recharging unit 65. This invention may be employed in many environments including marine and aeronautical, as well as ground applications. In the illustrated embodiment, the solar collection assembly is carried upon a pick-up truck tool box located at the truck's bed. It should be understood, however, that the solar collector may be mounted at any location upon the truck or associated accessory components such as the tool box in the illustration. The solar collector 15 is connected to the tool box by a mounting bracket 80 being fixed at one end to the tool box and having a cyclops connector 85 at an opposite end. The collector 15 is fastened to or mounted upon the cyclops connector 85. The solar collection assembly 15 is most suitably mounted on a tool box or similar fixture because it is within such a tool box that power tools requiring recharging will most often be stored and within which a suitable mounting location will likely be found for the docking station of the recharging unit 65.

The collector 15 is mounted upon the cyclops connector 85 of goose neck type connection so that the energy receiving faces of the unit may be variously positioned to more directly face the sun or other light source. In this way, the collector 15 can be rotated and pivoted so that the solar panels face the sun or possibly headlights of approaching and following vehicles. By using such a connection, the collector may be positioned independently of the carrying vehicle.

The solar collection assembly 15 comprises a rectangular frame 20 within which one or more solar panels 25 are housed between a front-side panel 30 and a back-side panel 35. In the illustrated embodiment, and as may be particularly appreciated in FIG. 1, two solar panels 25 are utilized to collect solar energy and convert it into electrical power. The solar panels 25 are cushioned within the frame 20 by pads (not shown) that effectively "float" the panels 25 safely within the frame 20. The purpose of the pads is to provide a shock absorbing buffer between the ridged frame portions 20 and the more delicate panels 25.

The front-side panel 30 covers the receiving portions of the solar panels 25 and is constructed from plexiglass or tempered glass and serves as a protector thereof. Solar energy is permitted to pass through the front-side panel 30 even though a satin finish or similarly opaque treatment may be applied. The purpose of such a finish is to conceal the interior components and workings of the solar collection assembly 15. Similarly, the back-side panel 35 is constructed from half-inch thick acrylic that protects the back-side of the solar panel 25.

Figure 3:
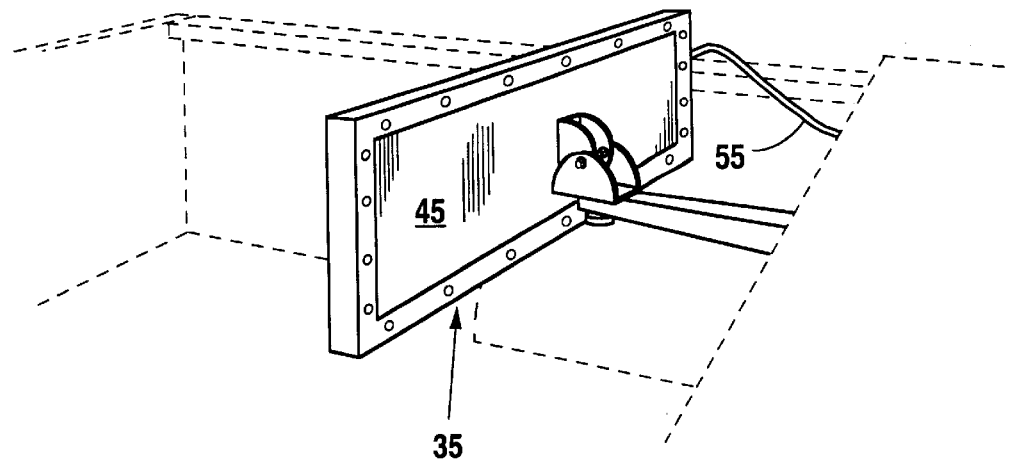
FIG. 3 is a backside view of the solar collection assembly.
Figure 4:
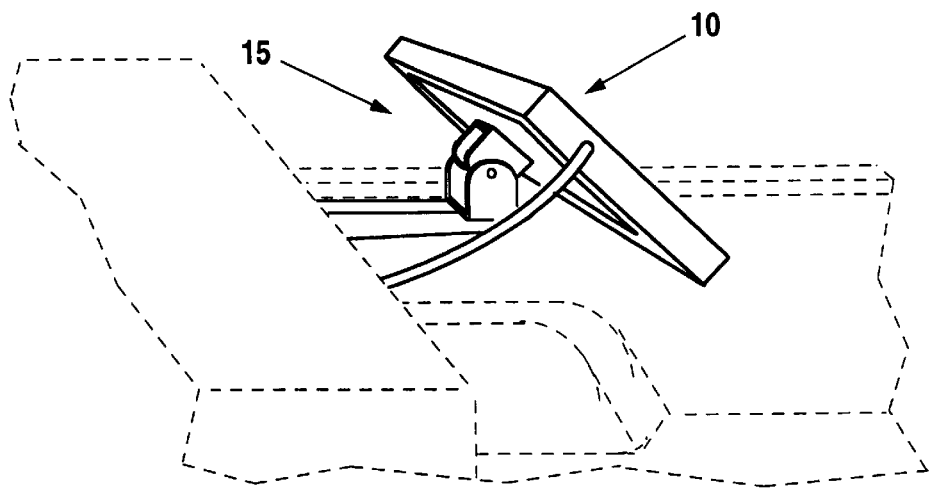
FIG. 4 is a side view of the solar collection assembly in a tilted orientation.
Figure 5:
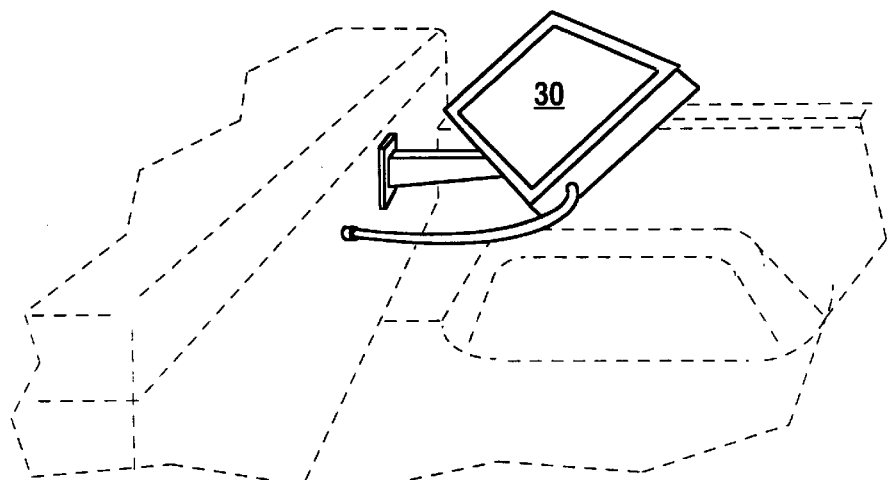
FIG. 5 is a side view of the solar collection assembly in a pivoted configuration so that the solar panel is directed forwardly substantially opposite to the orientation of FIG. 4.

As may be seen in FIG. 3, between the solar panel 25 and back-side panel 35 is a layer of anti-static insulation 45 that in the illustrated embodiments is blue in color. The purpose of this insulation is to protect the solar panels and to attract static electricity away therefrom. This is somewhat of a redundant feature in that the solar panels individually include static barriers for protecting the component parts and to assure proper operation.

Once these several components are assembled into the solar collection assembly 15, a rubber coating 45 is applied thereto to provide a protective and sealing exterior that in the finished product will completely cover the sides of the frame 20 and the entirety of the back-side panel 35. That is to say, in the commercialized embodiment of the invention, the anti-static insulation 45 would not be visible nor would the connective features of the panels 30 and 35 to the frame 20.

By coating the solar connector 15 in the rubber protectant, it is made weather proof in that it retards water and is essentially impervious thereto. An exception is an optional breathing hole that is provided through the frame 20 and is of a sufficiently small dimension that water does not invade the solar collector 15 therethrough. Moisture, however, that does successfully penetrate the shell of the assembly 15 is permitted to evaporate through the hole thereby diminishing the likelihood of adverse affects resulting therefrom.

As long as the solar panels 25 are exposed to light, they will continue to convert light energy into electric power. Therefore, one way to "turnoff" the recharger assembly 10 is to cover the solar panels 25 thereby preventing contact by light energy. Such a face cover 50 is contemplated, but is not shown in the illustrated photographs. It is anticipated that such a cover could be customized for the end user. The cover 50 provides a suitable display for the tradename of the invention or that of purchaser's business if so desired. Alternatively, the cover 50 may be constructed from pliable vinyl material that is backed by a soft felt that contacts the solar collection assembly 15. A "jacket" effect can be created by making the cover 50 snapable to the framed structure of the assembly 15.

Figure 2:
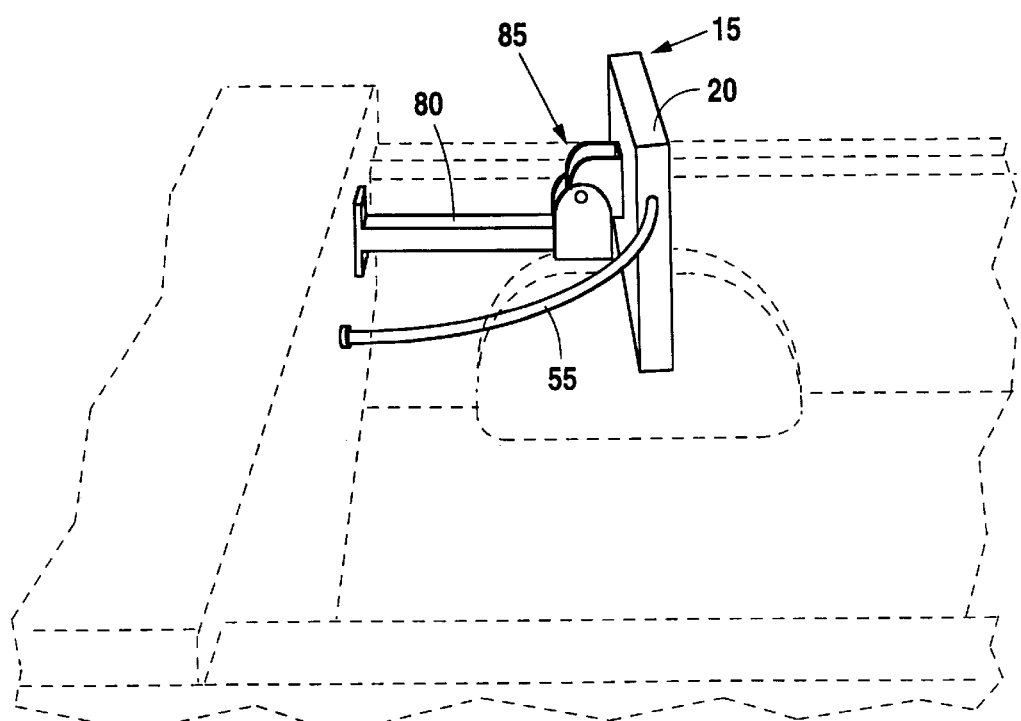
FIG. 2 is a side view of the solar collection assembly in a substantially backward facing and vertical orientation.

The electrical energy generated in the solar collection assembly 15 is communicated or conveyed to one or more power receiver 65 by the electrical connective wiring 60 that is protectively run through an electrical conduit sheath 55. The sheath 55 is best appreciated in FIG. 2 where the stainless steel conduit sheath 55 is shown. Wiring 60 is carried within the sheath 55 and a passage way is provided by way of a hole through the side wall of the tool box into the interior space where the battery recharging unit 65 is housed. The pass-through is accomplished by way of a grommetted aperture 70 that also serves as a weather proof passage for the electrical connective wiring 60. The interior diameter of the aperture 70 comprises a compressive material such as rubber or foam that affectively seals upon the connective wiring 60. To present a more aesthetically pleasing appearance, a finishing cap may also be provided at the grommet about the connective wiring 60 to enhance the appearance of the invention when installed through the tool box.

Figure 6:
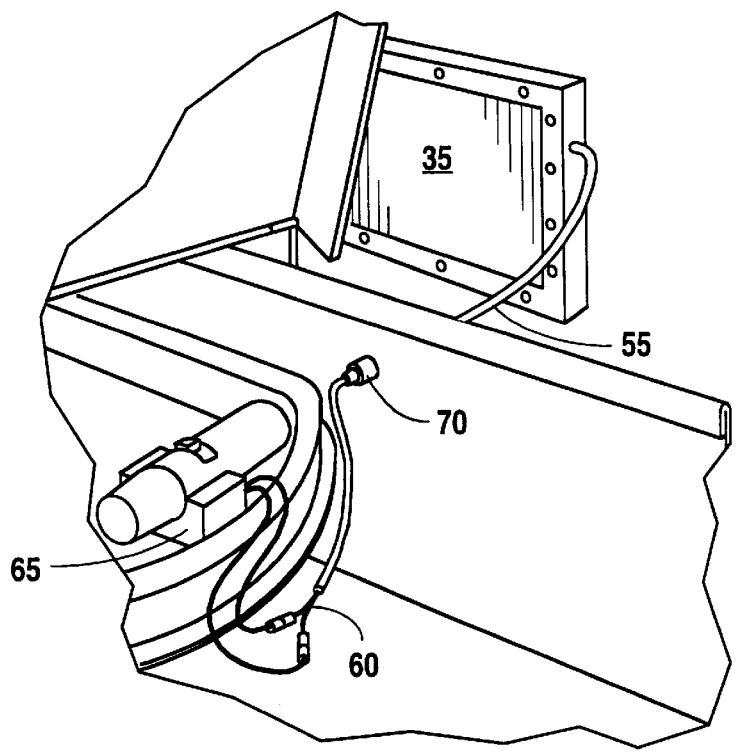
FIG. 6 illustrates the electrical couplings between the solar collection assembly and the power receiver in the form of a battery recharging unit.

As may be appreciated in FIG. 6, the battery recharging unit 65 is connected to the wiring 60 by adapter plugs having positive and negative leads. Conventionally, these two leads are colored red and black. A diode is included interstitially along the connective wiring 60 for one-way control of the power passing therethrough. That is to say, power is only permitted to leave the solar collection assembly 15 and not flow backward from the battery pack of the power receiver 65 toward the collection assembly.

The capacity of the present invention for generating usable electrical power is variable. By varying the size and number of amorphous glass solar collection panels, greater and lesser amounts of electrical power may be produced. In at least one embodiment, the recharger assembly 10 generates 40 volts of energy and 15 to 20 amperes of power. It should be appreciated, however, that the specific capacities are not controlling, but are instead a resultant of the design characteristics of an individual recharger unit 10.

While a connection to a battery recharging unit has been shown within the interior of a pick-up truck tool box, it is also contemplated that wiring may be accomplished into the interior of the vehicle. In this way, the present invention may be used to provide much needed recharging capabilities for items such as cellular telephones and personal portable computers used within the passenger compartment during both travel and when parked.

An alternative embodiment a solar collection assembly 15 similar to that of the above disclosed embodiment is mounted to a tool box positioned within the bed of a pick-up truck. This embodiment includes an alternative configuration for the solar panel 25. The previously described panel 25 is constructed from amorphous glass within which the individual solar cells are incorporated. This alternative embodiment includes a solar panel 25 that comprises a plurality of individual solar cells of a poly-crystalline design that are wired together in series to provide the desired electrical output. The panel's 25 construction is mechanically accomplished by first placing the individual solar cells upon a plastic sheet that establishes the face of the panel 25. The orientation of the several solar cells is then fixed by laminating a second sheet thereabove effectively sealing the cells within an interior of the laminated panel 25.

Figure 7:
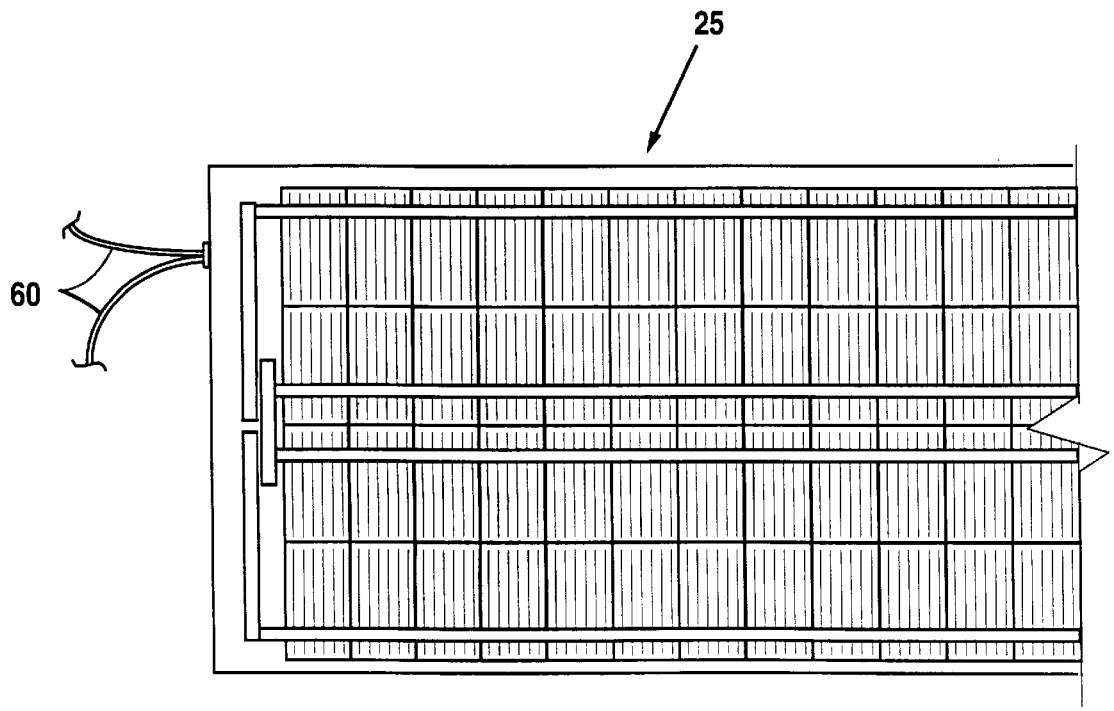
FIG. 7 is a detail view of a plurality of solar cells serially interconnected.
Figure 8:
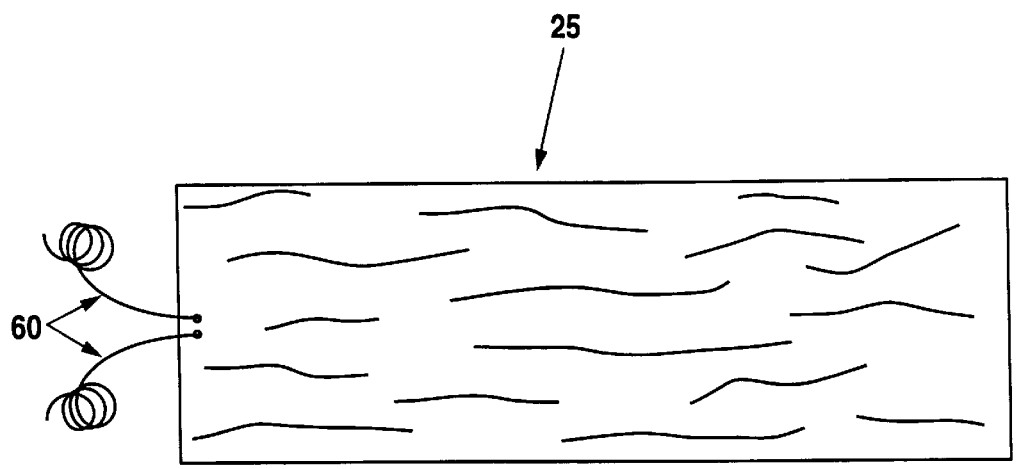
FIG. 8 is a backside view of the solar panel showing the electrical connective wiring that extends therefrom to the power receiver.
Figure 9:
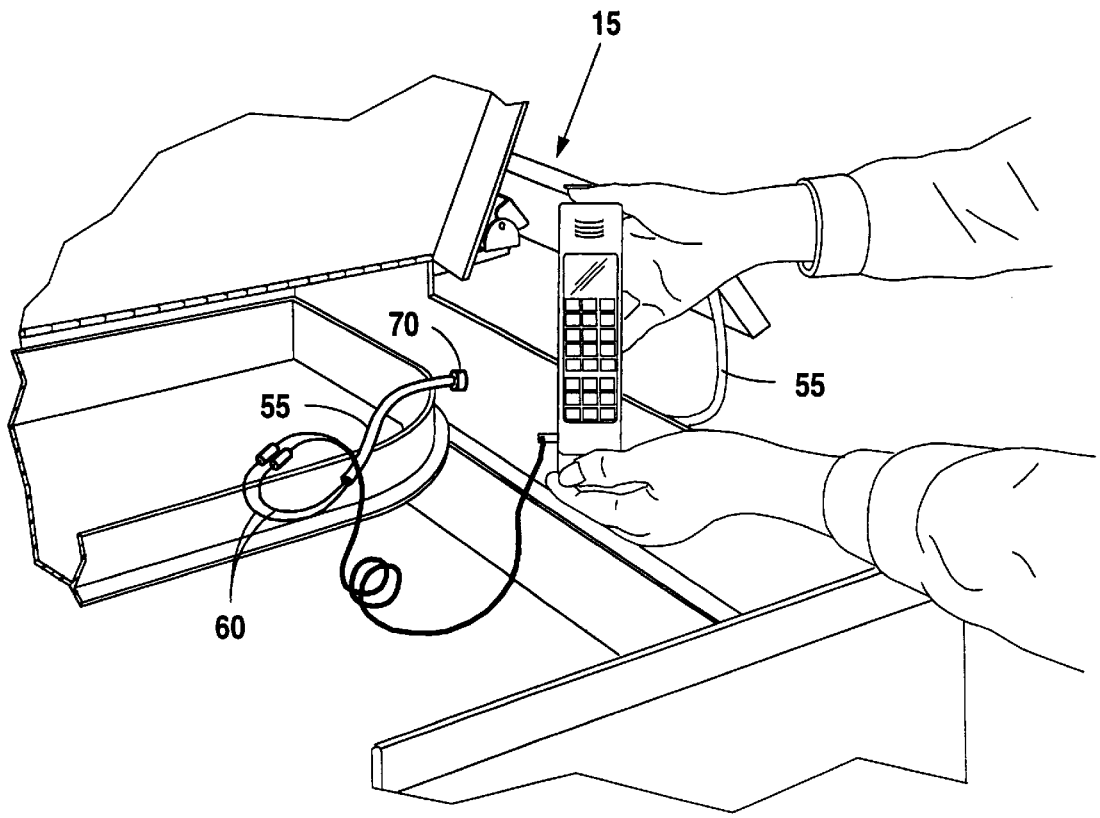
FIG. 9 is a perspective view inside the tool box illustrating the power receiver and a cellular telephone connected thereto for recharging.
Figure 10:
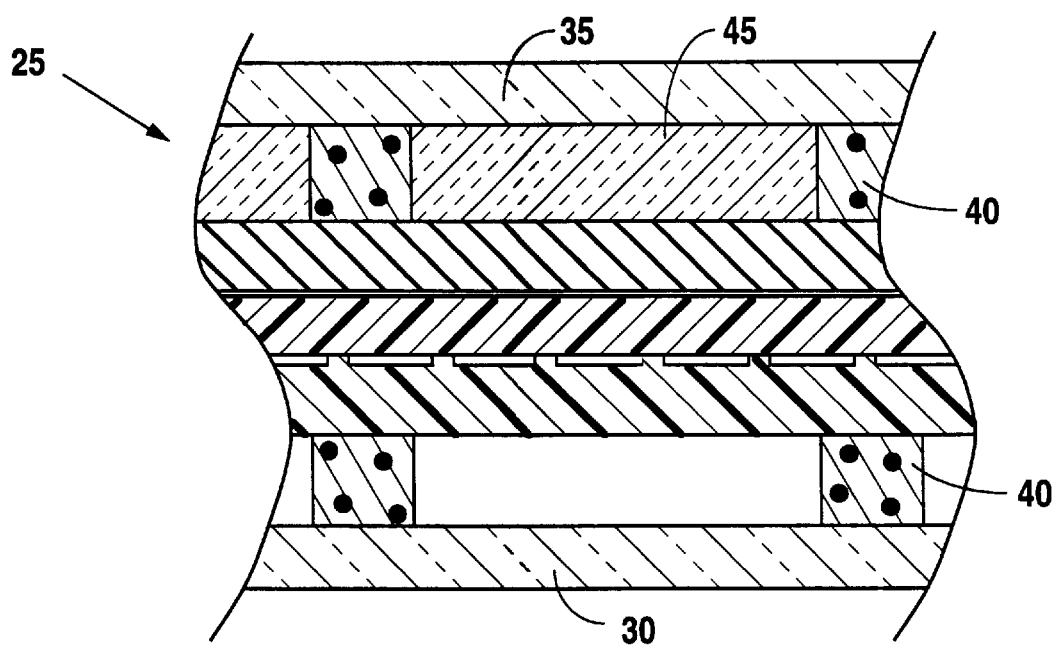
FIG. 10 is a cross-sectional view of the solar panel.

Electrically conductive members are connected between each of the several solar cells establishing a chain of cells. In this way, a collective energy production is communicated to the discharge electrical wiring 60. This series connection of solar cells is best appreciated in FIG. 7 viewed through the front sheet of the laminate panel 25. This construction renders a relatively flexible solar panel that must be fortified for application in the present invention to provide rigidity thereto. Therefore, a more rigid sheet of acrylic is added to the backside of the panel and bonded thereto by silicon. In the preferred embodiment, this acrylic sheet is $7/16$ inch thick and provides the panel 25 sufficient fortitude to maintain its intended configuration when incorporated into the collector's frame 20.

The cyclops connector 85 has been supplemented with a rotable tightener that fixes and releases the connection for positioning the solar collector 15 in a variety of desired positions. Furthermore, a gasket has been incorporated between the frame 20 and backside panel 35. This added gasket better assures the weather proof nature of the collector 15. As previously described, the frame with the gasket interiorly located therein is then coated in a rubberizing substance that absolutely seals the assembly. In this embodiment, the breather hole is not provided in that no moisture is expected to invade the interior space of the collector 15.

In this alternative embodiment, the back surface of the front side panel 30 is textured to diffuse light entering the collector 15 so that direct light beams are not directed upon the solar panel. Instead, the light is diffused and less directly applied to the individual solar cells. This is provided for both aesthetic purposes and to protect the solar panels from too intense light. In this embodiment, both the front side panel 30 and back side panel 35 are constructed from tempered glass. As described with respect to the first embodiment, the solar panel 25 is cushioned within the frame 20 by foam floater pads that properly position and fix the location of the panel within the collector assembly 15.

In this alternative embodiment, the arrangement of solar cells as illustrated produces a twenty (20) volt voltage that suitably supplies rechargers requiring as much as twelve (12) volts or less. While lower volts may be produced depending upon the light source directed upon the panels, a sufficient energy production will be accomplished, it may just take a greater period of time. At this voltage, the recharger assembly 10 is designed to produce 550 milliamps of current for recharging purposes. As may be appreciated by those familiar with recharging systems of the nature described, these electricity producing capabilities are more than sufficient for recharging most hand held battery pack powered tools and portable electronic equipment.

Though several embodiments of the present invention have been described, it should be appreciated that other embodiments fit within the spirit of the invention though they may include additional or fewer components, or differently configured components.

What is claimed and desired to be secured by Letters Patent is as follows:

1. A light energy powered charging system for recharging portable units such as battery powered hand tools and cellular telephones, said charging system comprising:
   a solar collection assembly having at least one light energy receiving panel, said collection assembly being mountable to a carrying vehicle;
   a multi-position connector coupled to said receiving panel for facilitating the positioning of said panel toward a light source such as the sun or vehicle headlights;
   a power receiver electrically connected to said receiving panel for accepting electricity generated at said solar collection assembly; and
   said power receiver having a docking station for releasably receiving a battery powered portable unit such as a powered hand tool or a cellular telephone requiring recharging.

2. The invention as recited in claim 1, said charging system further comprising:
   a carrying motor vehicle, said solar collection assembly coupled to said carrying motor vehicle by said multi-position connector.

3. The invention as recited in claim 2, said charging system further comprising:
   said carrying motor vehicle being a pick-up truck having a tool box located in a bed of said truck, said solar collection assembly coupled to said tool box by said multi-position connector.

4. The invention as recited in claim 3, said charging system further comprising:
   said power receiver being positioned within said tool box located in a bed of said truck.

5. The invention as recited in claim 2, said charging system further comprising:
   said multi-position connector being a cyclops connector permitting said solar collection assembly to be variously positioned so that said at least one light energy receiving panel is faceable toward a light source.

6. The invention as recited in claim 2, said charging system further comprising:
   said multi-position connector having a first pivot connection for rotating said solar collection assembly about a substantially horizontal axis between backward and forward facing configurations.

7. The invention as recited in claim 2, said charging system further comprising:
   said multi-position connector having a second pivot connection for swinging said solar collection assembly about a substantially vertical axis between different sideward facing configurations.

8. The invention as recited in claim 6, said charging system further comprising:
   said multi-position connector having a second pivot connection for swinging said solar collection assembly about a substantially vertical axis between different sideward facing configurations.

9. The invention as recited in claim 2, said charging system further comprising:
   a power hand tool installed into said docking station of said power receiver for recharging a battery pack housed within said hand tool.

10. The invention as recited in claim 2, said charging system further comprising:
    a cellular telephone installed into said docking station of said power receiver for recharging a battery pack housed within said cellular telephone.

11. The invention as recited in claim 2, said charging system further comprising:
    said solar collection assembly having a frame within which said at least one light energy receiving panel is coupled between a front-side panel and a back-side panel, said front-side panel and said back-side panel for protecting said at least one light energy receiving panel.

12. The invention as recited in claim 11, said charging system further comprising:
    anti-static insulation sandwiched between said at least one light energy receiving panel and said back-side panel for attracting static electricity away from said light energy receiving panel.

13. The invention as recited in claim 2, said charging system further comprising:
    a rubber coating adhered to at least a portion of an exterior surface of said solar collection assembly for protecting said solar collection assembly and resisting the invasion of moisture into an interior of said solar collection assembly.

14. The invention as recited in claim 2, said charging system further comprising:

a flexible cover wrapped about an exterior surface of said solar collection assembly for protecting said solar collection assembly.

15. The invention as recited in claim 14, said charging system further comprising:

said flexible cover being releasably coupled to said solar collection assembly.

16. The invention as recited in claim 15, said charging system further comprising:

said releasable couplement between said flexible cover and said solar collection assembly being snap connectors.

17. The invention as recited in claim 16, said charging system further comprising:

said flexible cover being opaque thereby preventing light energy from reaching said solar collection assembly when said cover is installed thereupon and thereby preventing the generation of electrical energy by the charging system.

18. The invention as recited in claim 3, said charging system further comprising:

said solar collection assembly being electrically connected to said power receiver by electrical connective wiring passing through a wall of said tool box.

19. The invention as recited in claim 18, said charging system further comprising:

a passage through said wall of said tool box being a grommetted aperture through which said electrical connective wiring extends, said grommetted aperture at least partially forming a seal about said wiring thereby resisting the invasion of moisture into said interior of said tool box.

20. The invention as recited in claim 18, said charging system further comprising:

an electrical conduit sheath surrounding said electrical connective wiring between said solar collection assembly and said wall of said tool box.

* * * * *